(12) United States Patent
Mohr et al.

(10) Patent No.: US 10,293,747 B2
(45) Date of Patent: May 21, 2019

(54) SYSTEMS AND METHODS FOR VEHICLE BATTERY LEAK DETECTION AND MITIGATION

(71) Applicant: Ford Global Technologies, LLC, Dearborn, MI (US)

(72) Inventors: Jeff Raymond Mohr, Shelby Township, MI (US); Hanyang B. Chen, Canton, MI (US); Michael J. Irby, Monroe, MI (US); Gabriel Jim, Canton, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 0 days.

(21) Appl. No.: 15/713,382

(22) Filed: Sep. 22, 2017

(65) Prior Publication Data
US 2019/0092230 A1 Mar. 28, 2019

(51) Int. Cl.
G01R 31/36 (2006.01)
G01F 9/00 (2006.01)
B60Q 9/00 (2006.01)

(52) U.S. Cl.
CPC ............. B60Q 9/00 (2013.01); G01F 9/001 (2013.01); G01R 31/3606 (2013.01)

(58) Field of Classification Search
CPC ....................................................... B60Q 9/00
USPC ........................................................ 340/455
See application file for complete search history.

(56) References Cited

U.S. PATENT DOCUMENTS

| 3,798,528 | A | | 3/1974 | Molyneux | |
| 4,499,424 | A | * | 2/1985 | Rowlette | G01R 31/3665 324/427 |
| 5,184,109 | A | | 2/1993 | Tanaka | |
| 6,204,769 | B1 | | 3/2001 | Arai | |
| 6,404,163 | B1 | | 6/2002 | Kapsokavathis | |
| 9,914,337 | B2 | * | 3/2018 | Zhou | B60H 1/00492 |
| 2004/0241512 | A1 | * | 12/2004 | Muto | H01M 8/04179 429/429 |
| 2009/0051346 | A1 | * | 2/2009 | Manabe | B60L 11/1887 323/363 |
| 2009/0117427 | A1 | * | 5/2009 | Manabe | H01M 8/04649 429/430 |
| 2010/0062322 | A1 | * | 3/2010 | Murata | H01M 2/1016 429/82 |

(Continued)

FOREIGN PATENT DOCUMENTS

CN 203211119 U 9/2013
CN 205920110 U 2/2017
(Continued)

*Primary Examiner* — Santiago Garcia
(74) *Attorney, Agent, or Firm* — Frank Lollo; James P. Muraff; Neal, Gerber & Eisenberg LLP

(57) ABSTRACT

Method and apparatus are disclosed for detecting and mitigating vehicle battery gas emission into the vehicle cabin. An example vehicle includes a battery, a vent tube coupled to the battery for venting gas outside a vehicle cabin, a gas flow sensor for determining a measured flow rate at an end of the vent tube opposite the battery, and a processor. The processor is configured for determining an expected flow rate range based on a battery characteristic, and responsive to determining that the measured flow rate is outside the expected flow rate range, initiating a protective action.

20 Claims, 4 Drawing Sheets

(56) References Cited

U.S. PATENT DOCUMENTS

| | | | |
|---|---|---|---|
| 2011/0101920 A1* | 5/2011 | Seo | B60L 11/1861 |
| | | | 320/127 |
| 2012/0021301 A1* | 1/2012 | Ohashi | B60K 1/04 |
| | | | 429/400 |
| 2013/0040173 A1* | 2/2013 | Yokoyama | H01M 2/1061 |
| | | | 429/53 |
| 2013/0181826 A1* | 7/2013 | Yang | H01M 10/4228 |
| | | | 340/455 |
| 2015/0246650 A1* | 9/2015 | Nakajima | B60K 1/04 |
| | | | 180/68.5 |
| 2016/0097821 A1 | 4/2016 | Eifert | |
| 2016/0133996 A1 | 5/2016 | Fukuhara | |
| 2016/0236536 A1* | 8/2016 | Hirakata | B60L 3/0053 |
| 2016/0344056 A1* | 11/2016 | Kniajanski | H01M 8/188 |
| 2018/0026243 A1* | 1/2018 | Stojanovic | H01M 10/613 |
| | | | 429/99 |
| 2018/0026284 A1* | 1/2018 | Nishida | H01M 8/04604 |
| | | | 429/432 |
| 2018/0062228 A1* | 3/2018 | Wuensche | H01M 10/613 |

FOREIGN PATENT DOCUMENTS

| | | |
|---|---|---|
| DE | 102013204312 A1 | 9/2014 |
| JP | 2003009402 A | 1/2003 |
| JP | 2008123717 A | 5/2008 |
| JP | 2009284731 A | 12/2009 |
| KR | 20160052457 A | 5/2016 |
| WO | WO 2014100937 A1 | 7/2014 |

* cited by examiner

SYSTEMS AND METHODS FOR VEHICLE BATTERY LEAK DETECTION AND MITIGATION

TECHNICAL FIELD

The present disclosure generally relates to vehicle battery leak detection and, more specifically, systems and methods for detecting and mitigating issues caused by vehicle battery gas leakage.

BACKGROUND

Many modern vehicles may include batteries that can be used to power one or more electronic systems of the vehicle. During use of the battery, and in particular while recharging, the battery may emit gas. This is due to chemical reactions that occur within the battery cells. This emitted gas may be harmful to humans, and may be vented outside the vehicle cabin for safety reasons.

SUMMARY

The appended claims define this application. The present disclosure summarizes aspects of the embodiments and should not be used to limit the claims. Other implementations are contemplated in accordance with the techniques described herein, as will be apparent to one having ordinary skill in the art upon examination of the following drawings and detailed description, and these implementations are intended to be within the scope of this application.

Example embodiments are shown describing systems, apparatuses, and methods for detecting and mitigating problems caused by gas leaking from a vehicle battery. An example disclosed vehicle includes a battery, a vent tube coupled to the battery for venting gas outside a vehicle cabin, a gas flow sensor for determining a measured flow rate at an end of the vent tube opposite the battery, and a processor. The processor may be configured for determining an expected flow rate range based on a battery characteristic, and responsive to determining that the measured flow rate is outside the expected flow rate range, initiating a protective action.

An example disclosed method includes determining, by a gas flow sensor, a measured flow rate of gas emitted by a battery, wherein the gas flow sensor is positioned at a first end of a vent tube opposite a second end of the vent tube coupled to the battery, and wherein the vent tube is configured to vent the gas outside a vehicle cabin. The method also includes determining an expected flow rate range based on a battery characteristic. And the method further includes, responsive to determining that the measured flow rate is outside the expected flow rate range, initiating a protective action.

A third example may include means for determining, by a gas flow sensor, a measured flow rate of gas emitted by a battery, wherein the gas flow sensor is positioned at a first end of a vent tube opposite a second end of the vent tube coupled to the battery, and wherein the vent tube is configured to vent the gas outside a vehicle cabin. The example may also include means for determining an expected flow rate range based on a battery characteristic. And the example may further include means for, responsive to determining that the measured flow rate is outside the expected flow rate range, initiating a protective action.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

Figure 1:
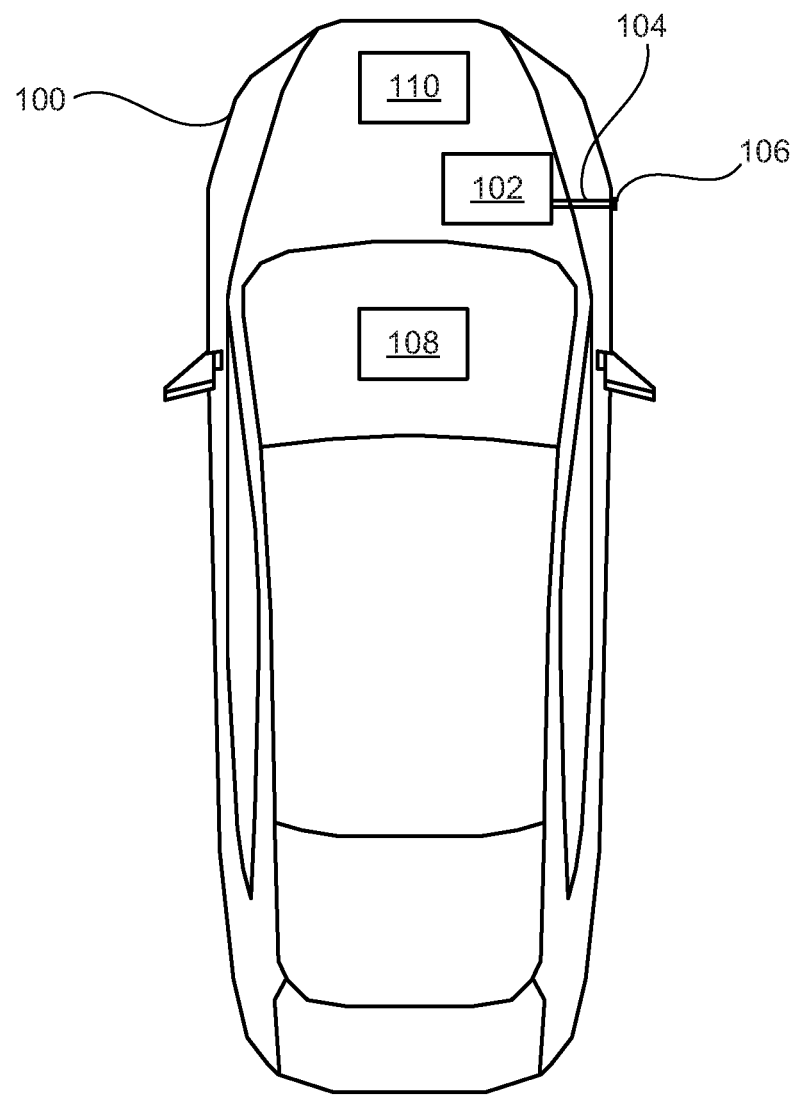
FIG. 1 illustrates an example vehicle according to embodiments of the present disclosure.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

As noted above, vehicles may include one or more batteries that can power electronic systems of the vehicle. These batteries may emit gas when operating under certain conditions, such as while charging or discharging. Further, certain failure states may cause the batteries to emit relatively high levels of gas. This gas can be harmful, and for safety reasons it may be beneficial to vent this gas outside the vehicle cabin and away from any vehicle occupants.

Do vent the gas properly, a vent tube may be coupled on one end to the battery, and on the other end may allow the gas to be emitted outside the vehicle. Problems may arise, however, where the vent tube coupling to the battery comes undone, or where there is a hole or leak in the vent tube inside the vehicle. In these instances, the gas may be emitted into the cabin, causing potential harm to any occupants.

In order to detect and mitigate problems caused by missing or uncoupled vent tubes and/or holes in the vent tube, example embodiments herein may include positioning a gas flow sensor on an end of the vent tube opposite the battery. The gas flow sensor may thus be configured to detect and measure gas flow at the outside end of the vent tube, or the end of the vent tube that emits gas outside the vehicle. The detected gas flow level may thus be affected by holes in the upstream end of the vent tube, or a disconnection between the upstream end of the vent tube and the battery itself.

Examples herein may also include monitoring one or more battery metrics or battery characteristics, such as charging voltage level, charging current level, state of charge, and more. The vehicle may then determine an expected flow rate range based on one or more battery characteristics. The flow rate range may include an expected maximum and expected minimum gas flow rate, which when combined may provide the expected flow rate range. In one example, for instance, the battery may have a first expected flow rate range while charging at 13 volts, and may have a second, different expected flow rate range while charging at 14 volts. Other characteristics may be factored in as well.

Then, where it is determined that the measured flow rate is outside the expected flow rate range (i.e., either higher or lower than the expected flow rate range), that may indicate that there is an issue, either that the vent tube has been disconnected, there is a hole in the vent tube, or that the battery has a shorted cell, is experiencing electrolysis in one or more cells, or is otherwise not functioning as expected.

Then based on this determination, one or more protective actions may be taken, such as disconnecting the battery, providing an alert or warning to the driver or a service technician, modifying a charging voltage or other electrical characteristic, or taking some other action. These protective actions may prevent or mitigate harm that may be caused by gas from the battery being emitted into the vehicle cabin.

FIG. 1 illustrates an example vehicle 100 according to embodiments of the present disclosure. Vehicle 100 may be a standard gasoline powered vehicle, a hybrid vehicle, an electric vehicle, a fuel cell vehicle, or any other mobility implement type of vehicle. Vehicle 100 may be non-autonomous, semi-autonomous, or autonomous. Vehicle 100 includes parts related to mobility, such as a powertrain with an engine, a transmission, a suspension, a driveshaft, and/or wheels, etc. In the illustrated example, vehicle 100 may include one or more electronic components (described below with respect to FIG. 2).

As shown in FIG. 1, vehicle 100 may include a battery 102, a display 108, and a processor 110. A vent tube 104 may be coupled to battery 102 on a first end, and there may be a gas flow sensor 106 coupled to a second end of vent tube 104, Vehicle 100 may include one or more additional electronic components, described in further detail with respect to FIG. 2.

Battery 102 may be any suitable battery type for a vehicle, such as a lead-acid battery, lithium-ion battery, and more. Further, battery 102 may include one or more cells or other components connected in series or parallel. In some examples, battery 102 may be positioned in the engine compartment of vehicle 100. Alternatively, battery 102 may be positioned in the trunk, or in another area of vehicle 100. Still further, in some examples such as for all-electric or hybrid vehicles, battery 102 may be distributed throughout vehicle 100 or may cover a large area (such as under the passenger compartment).

A vent tube 104 may be coupled on a first end to battery 102, and may be open on a second end. This is shown in more detail below with respect to FIG. 3. Gas emitted by the battery may pass through vent tube 104 and be emitted outside the vehicle cabin. Further, a gas flow sensor 106 may be coupled to the second end of vent tube 104, such that any gas flowing out the vent tube may be detected by gas flow sensor 106. In this manner, gas flow sensor can detect when the first side of vent tube 104 is disconnected, or whether there is a leak in the vent tube, based on an expected and a measure gas flow rate.

Display 108 may be any display configured to provide an alert or warning to a driver or other person connected with vehicle 100. For instance, display 108 may comprise a center console display or dashboard display, configured to provide information to the vehicle occupants. The display may be configured to blink, display an alert, or otherwise notify the occupant(s) that there is a problem with the battery vent hose. For instance, the alert may indicate that the vent hose has come undone from the battery, or that there is a leak in the hose. Other alerts are possible as well.

In some examples, the alert may be displayed or shown when the vehicle is brought to a service station or dealership. Further, an alert may be provided upon startup of the vehicle. There is a high probability that a disconnected vent tube may occur when the battery is replaced, and the vent tube is inadvertently left disconnected from the new battery. As such, it may be beneficial to alert the driver when the vehicle is started after the battery has been replaced.

Vehicle 100 may also include a processor 110. Processor 110 may be configured to receive data from one or more sensors, such as gas flow sensor 106, one or more battery sensors, and more. Processor 110 may determine an expected gas flow range based on one or more battery characteristics. For instance, one or more battery sensors may provide information to the processor such as a charging voltage, charging current, state of charge, time of charge, load, and more. This information may be used to determine an expected gas flow range. For instance, when the battery is being charged at a first voltage, there may be a minimum and a maximum expected amount of gas emitted by the battery due to chemical reactions taking place within the battery. This expected range may be compared to an actual or measured gas flow rate at the second end of vent tube 104. If the measured flow rate is outside the expected flow rate range, the processor may determine that the vent tube is disconnected, that there is a leak in the vent tube, or that there is an issue with the battery (e.g., shorted cell, electrolysis, or other problem).

Responsive to determining that the measured flow rate is outside the expected flow rate range, the processor may initiate a protective action. This protective action may include modifying a charging voltage, current, or other value, activating one or more vehicle systems, alerting the driver or other party, stopping or preventing the battery from being charged, and more.

In some examples the flow rate may refer to a measured rate of gas emitted by the battery. Determining the flow rate may include measuring a pressure level at one or more locations, and determining a difference between the measured pressure levels. The flow rate may then be inferred from the measured pressure levels.

The flow rate, as used herein, may be determined directly or inferred based on measurements from one or more sensors. The sensors may include mechanical flow sensors, pressure based flow sensors, optical flow sensors, thermal flow sensors, and/or any other type of sensor configured to determine a rate of flow of a gas. As such, the methods and techniques disclosed herein are illustrative of one or more example techniques, and should not be understood as an exhaustive or exclusive list.

Figure 2:
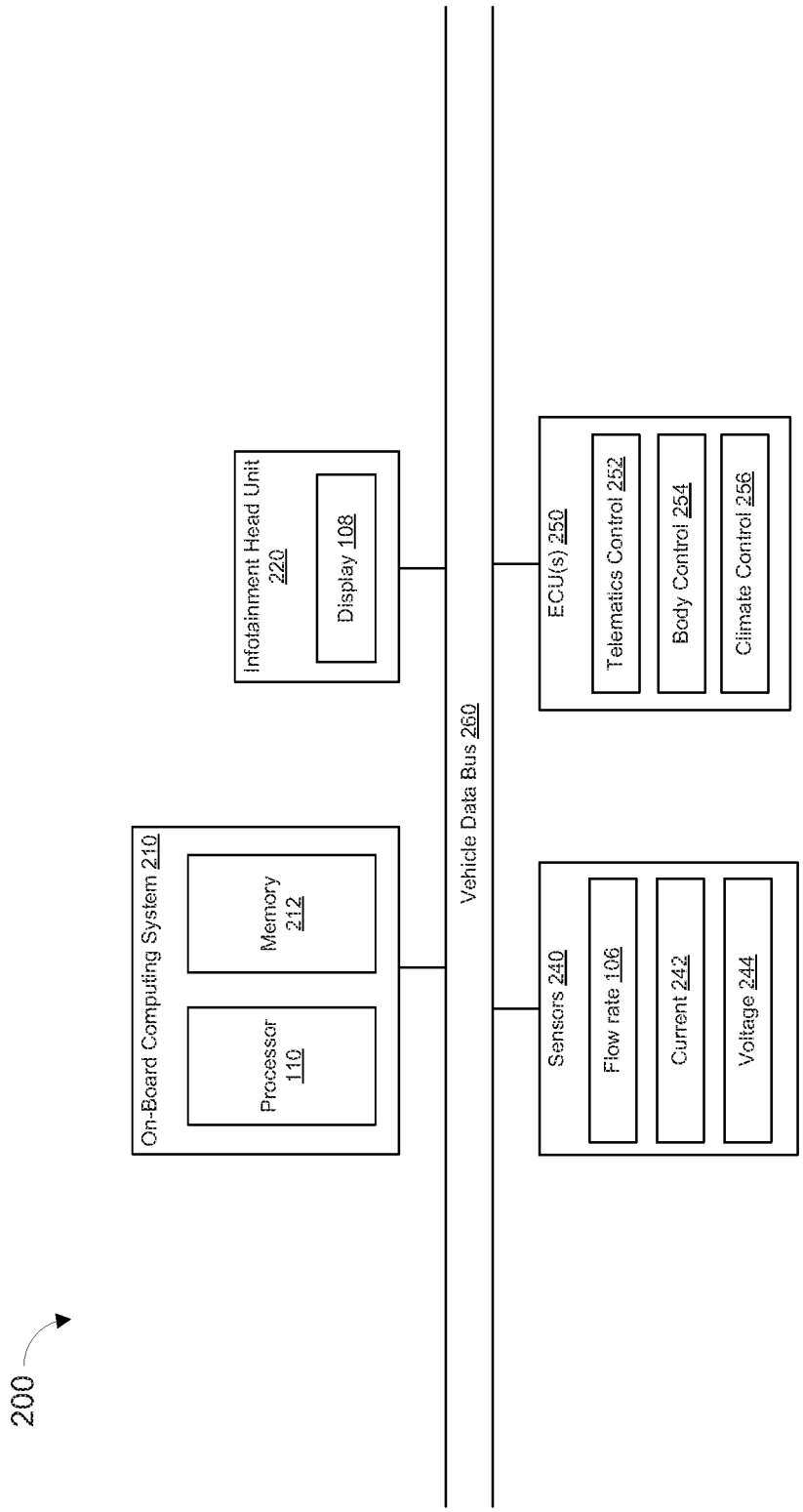
FIG. 2 illustrates an example block diagram of electronic components of the vehicle of FIG. 1.

FIG. 2 illustrates an example block diagram 200 showing electronic components of vehicle 100, according to some embodiments. In the illustrated example, the electronic components 200 include the on-board computing system 210, infotainment head unit 220, sensors 240, electronic control unit(s) 250, and vehicle data bus 260.

The on-board computing system 210 may include a microcontroller unit, controller or processor 110 and memory 212. Processor 110 may be any suitable processing device or set of processing devices such as, but not limited to, a microprocessor, a microcontroller-based platform, an integrated circuit, one or more field programmable gate arrays (FPGAs), and/or one or more application-specific integrated circuits (ASICs). The memory 212 may be volatile memory (e.g., RAM including non-volatile RAM, magnetic RAM, ferroelectric RAM, etc.), non-volatile memory (e.g., disk memory, FLASH memory, EPROMs, EEPROMs, memristor-based non-volatile solid-state memory, etc.), unalterable memory (e.g., EPROMs), read-only memory, and/or high-capacity storage devices (e.g., hard drives, solid state drives, etc). In some examples, the memory 212 includes multiple kinds of memory, particularly volatile memory and non-volatile memory.

The memory 212 may be computer readable media on which one or more sets of instructions, such as the software for operating the methods of the present disclosure, can be embedded. The instructions may embody one or more of the methods or logic as described herein. For example, the instructions reside completely, or at least partially, within any one or more of the memory 212, the computer readable medium, and/or within the processor 110 during execution of the instructions.

The terms "non-transitory computer-readable medium" and "computer-readable medium" include a single medium or multiple media, such as a centralized or distributed database, and/or associated caches and servers that store one or more sets of instructions. Further, the terms "non-transitory computer-readable medium" and "computer-readable medium" include any tangible medium that is capable of storing, encoding or carrying a set of instructions for execution by a processor or that cause a system to perform any one or more of the methods or operations disclosed herein. As used herein, the term "computer readable medium" is expressly defined to include any type of computer readable storage device and/or storage disk and to exclude propagating signals.

The infotainment head unit 220 may provide an interface between vehicle 100 and a user. The infotainment head unit 220 may include one or more input and/or output devices, such as display 108. The input devices may include, for example, a control knob, an instrument panel, a digital camera for image capture and/or visual command recognition, a touch screen, an audio input device (e.g., cabin microphone), buttons, or a touchpad. The output devices may include instrument cluster outputs (e.g., dials, lighting devices), actuators, a heads-up display, a center console display (e.g., a liquid crystal display (LCD), an organic light emitting diode (OLED) display, a flat panel display, a solid state display, etc.), and/or speakers. In the illustrated example, the infotainment head unit 220 includes hardware (e.g., a processor or controller, memory, storage, etc.) and software (e.g., an operating system, etc.) for an infotainment system (such as SYNC® and MyFord Touch® by Ford®, Entune® by Toyota®, IntelliLink® by GMC®, etc.). In some examples the infotainment head unit 220 may share a processor with on-board computing system 210. Additionally, the infotainment head unit 220 may display the infotainment system on, for example, a display 108 of vehicle 100.

Sensors 240 may be arranged in and around the vehicle 100 in any suitable fashion. In the illustrated example, sensors 240 include a flow rate sensor 106, a current sensor 242, and a voltage sensor 244. One or more other sensors may also be included as well, for the purpose of measuring one or more characteristics of the vehicle battery or batteries.

The ECUs 250 may monitor and control subsystems of vehicle 100. ECUs 250 may communicate and exchange information via vehicle data bus 260. Additionally, ECUs 250 may communicate properties (such as, status of the ECU 250, sensor readings, control state, error and diagnostic codes, etc.) to and/or receive requests from other ECUs 250. Some vehicles 100 may have seventy or more ECUs 250 located in various locations around the vehicle 100 communicatively coupled by vehicle data bus 260. ECUs 250 may be discrete sets of electronics that include their own circuit(s) (such as integrated circuits, microprocessors, memory, storage, etc.) and firmware, sensors, actuators, and/or mounting hardware. In the illustrated example, ECUs 250 may include the telematics control unit 252, the body control unit 254, and the climate control unit 256.

The telematics control unit 252 may control tracking of the vehicle 100, for example, using data received by a GPS receiver, communication module 230, and/or one or more sensors. The body control unit 254 may control various subsystems of the vehicle 100. For example, the body control unit 254 may control power a trunk latch, windows, power locks, power moon roof control, an immobilizer system, and/or power mirrors, etc. The climate control unit 256 may control the speed, temperature, and volume of air coming out of one or more vents. The climate control unit 256 may also detect the blower speed (and other signals) and transmit to the on-board computing system 210 via data bus 260. Other ECUs are possible as well.

Vehicle data bus 260 may include one or more data buses that communicatively couple the on-board computing system 210, infotainment head unit 220, sensors 240, ECUs 250, and other devices or systems connected to the vehicle data bus 260. In some examples, vehicle data bus 260 may be implemented in accordance with the controller area network (CAN) bus protocol as defined by International Standards Organization (ISO) 11898-1. Alternatively, in some examples, vehicle data bus 260 may be a Media Oriented Systems Transport (MOST) bus, or a CAN flexible data (CAN-FD) bus (ISO 11898-7).

Figure 3:
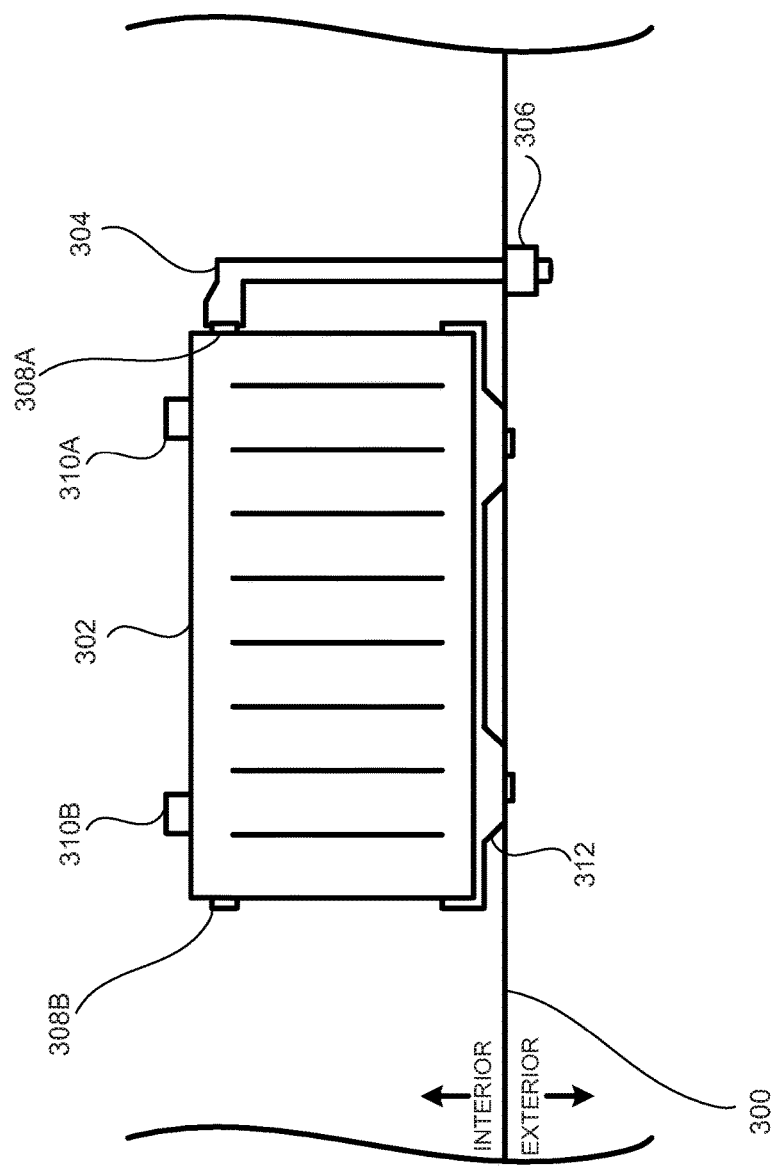
FIG. 3 illustrates a side cross section of an example battery mounted to a vehicle according to embodiments of the present disclosure.

FIG. 3 illustrates a side cross section view of a battery 302 mounted to an example vehicle 300. Battery 302 may include positive and negative connections (310A and 310B). Further, battery 302 may include a first vent port 308A and a second vent port 308B. The first vent port may be coupled to vent tube 304, which may allow gas emitted by battery 302 to be vented through the vent tube. The second vent port may be plugged or capped, to prevent gas from escaping the battery housing via the second vent port. Vehicle batteries may have two or more vent ports for venting gas. Examples disclosed herein may include plugs, caps, or other mechanisms for preventing gas from escaping the battery housing except though the vent port coupled to the vent tube (e.g., where there are three vent ports, two will be plugged and the third will be coupled to the vent tube). Alternatively, two or more vent tubes may be used, and each may be coupled to a respective vent port. Further, the two or more vent tubes may be coupled to each other, such that there is a single "downstream" or "output" end at which all gas from the battery is vented.

In FIG. 3, a first end of vent tube 304 is coupled to vent port 308A. The second end of vent tube 304 is disposed outside vehicle 300, shown as the "EXTERIOR" in FIG. 3.

Proximate the second end of vent tube 304 may be positioned gas flow sensor 306. Gas flow sensor 306 may be configured for determining a measured flow rate at the end of the vent tube opposite the battery. This orientation allows gas flow sensor to measure the gas flow at the downstream side of the vent tube, to allow the determination whether the vent tube is disconnected, blocked, leaking, or otherwise malfunctioning. In some examples, gas flow sensor 306 may be mounted to an exterior of vehicle 300. This may ensure that the sensor does not move around during movement of vehicle 300.

In some examples, a processor such as processor 110 may be configured to receive data from gas flow sensor 306. Based on this data, the processor may determine a measure flow rate of gas flowing through the end of vent tube 304.

The processor may also receive data from one or more other vehicle battery sensors, such as voltage and/or current sensors. The battery sensors may provide information to the processor for the purpose of determining an expected gas flow rate or emission rate. The chemical processes of the battery charging or discharging can cause gas to be emitted at a rate that correlates to the charging or discharging voltage and current, as well as the current battery state of charge, age, time that has elapsed since a previous charging event, and more. Information from these sensors may comprise a battery characteristic, which may be used to determine an expected gas flow rate. One particular battery characteristic may comprise a battery charging current level, or the level of current applied to the battery in order to charge it.

Determining the expected flow rate range may comprise determining one or more battery characteristics, and using a lookup table. For instance, a battery charging at 13 V may have a first expected gas flow rate, while a battery charging at 14 V has a slightly higher expected gas flow rate.

The processor may then determine whether the measured gas flow rate is within the expected flow rate range, or whether the measured flow rate is outside the expected flow rate range. If the measured flow rate is within the expected flow rate range, it may indicate that the vent tube is properly connected, and that the battery is operating normally. However, if the measured flow rate is below or above the expected flow rate range, it may indicate there is a problem. Two scenarios are detailed below.

(1) measured flow rate is below expected flow rate range—In this instance, the measured flow rate being below the expected flow rate range may indicate that vent tube 304 has become disconnected from battery 302, and the gas from the battery is being vented into the interior of vehicle 300. Alternatively, a low measure flow rate may indicate that there is a hole in vent tube 304 upstream from gas flow sensor 306. This too may indicate that gas from battery 302 is being vented into the vehicle interior.

Where it is determined that the measured rate is below the expected rate range, the processor may responsively initiate a protective action. The protective action may include providing an alert or warning to the driver indicating that there is a leak in the battery vent tube, or that the battery vent tube is disconnected. In addition, the alert may request the driver to reattach the vent tube or to visit a service station or dealership to have the battery checked. The protective action may also include stopping the charging or discharging of the battery, or disconnecting one or more electronic systems.

(2) measured flow rate is above expected flow rate range—In this instance, the measured flow rate being above the expected flow rate range may indicate that one or more battery cells have shorted out, and/or that electrolysis is taking place. Electrolysis may cause battery 302 to emit gas at a much higher rate, and can cause damage and limit the useful life of the battery.

Where it is determined that the measured rate is above the expected rate range, the processor may responsively initiate a protective action. The protective action in this scenario may include providing an alert or warning to the driver indicating that there is a problem with the battery, such as a short or problem with battery degradation. In addition, the alert may request the driver to reattach the vent tube or to visit a service station or dealership to have the battery checked. The protective action may also include stopping the charging or discharging of the battery, or disconnecting one or more electronic systems.

In some examples, the measured gas flow may be used as a feedback mechanism to monitor and change a charging voltage. When a charging battery reaches a particular state of charge (e.g., 85%), the charging efficiency for a given charging voltage may be reduced. As such, the applied voltage may no longer charge the battery, and may instead cause electrolysis to occur. This electrolysis may cause the battery to experience greater gas emission, which may be measured by the gas flow sensor. In response to detecting the gas flow rate has increased, the processor may reduce the charging voltage. As such, the measured gas flow rate may act as a feedback mechanism to control the charging voltage for the battery, to avoid electrolysis and other issues detrimental to the health of the battery.

Measured flow rate levels may be monitored over time as well. Both the absolute gas flow rate level and whether the flow rate is within the expected range over time can provide useful insight into the health of the battery, vent tube, and one or more other systems of the vehicle. For instance, where the measured flow rate is within the expected range for a period of time and suddenly changes, it may indicate that a problem has occurred. Similarly, where the measured gas flow rate is outside the expected range for a period of time, and then suddenly changes to being inside the expected range, that may indicate a problem. Alternatively, it may indicate that the vent tube has been replaced or reattached. In this case, example embodiments herein may include automatically removing or resetting an alert that would otherwise indicate the vent tube is not attached.

Further, some examples may include determining that the measured gas flow rate fluctuates between being inside the expected range and outside the expected range. This may indicate that there is a problem with the battery, sensor, or one or more other vehicle systems. In response, the processor may initiate an action to alert the driver.

In some examples, a vehicle may include a plurality of batteries. This may be particularly useful in hybrid or electric vehicles. Vehicle that include multiple batteries may include a plurality of gas flow sensors, wherein each battery has a corresponding gas flow sensor. Alternatively, two or more batteries may be coupled to the same gas flow sensor. For instance, a vehicle having two batteries may have a vent tube coupled to each, the vent tubes combined together, and a single gas flow sensor proximate the downstream end of the combined vent tube. The processor may monitor battery characteristics of each battery, as well as the measured flow rate from the gas flow sensor. When the measured flow rate is outside the expected flow rate range, that may indicate that there is an issue with one of the batteries coupled to the gas flow sensor.

Figure 4:
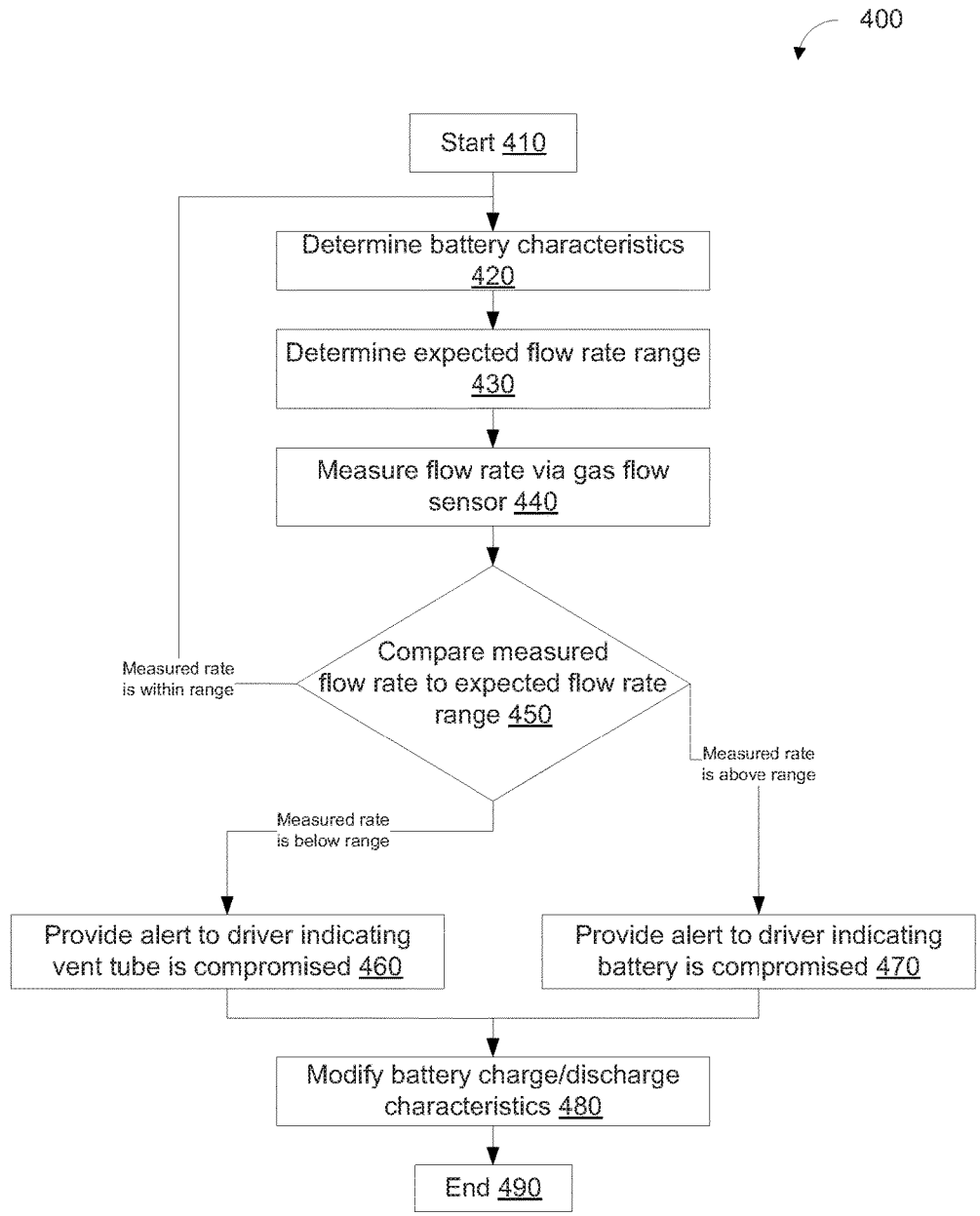
FIG. 4 illustrates a flowchart of an example method according to embodiments of the present disclosure.

FIG. 4 illustrates a flowchart of an example method 400 according to embodiments of the present disclosure. Method 400 may enable the detection and mitigation of gas being vented into a vehicle cabin. The flowchart of FIG. 4 is representative of machine readable instructions that are stored in memory (such as memory 212) and may include one or more programs which, when executed by a processor (such as processor 110) may cause vehicle 100 and/or one or more systems or devices to carry out one or more functions described herein. While the example program is described with reference to the flowchart illustrated in FIG. 4, many other methods for carrying out the functions described herein may alternatively be used. For example, the order of execution of the blocks may be rearranged or performed in series or parallel with each other, blocks may be changed, eliminated, and/or combined to perform method 400. Further, because method 400 is disclosed in connection with the components of FIGS. 1-3, some functions of those components will not be described in detail below.

Method 400 may start at block 410. At block 420, method 400 may include determining one or more battery characteristics. This may include receiving data from one or more battery sensors, such as current and voltage sensors, configured to detect various electronic metrics corresponding to the battery (e.g., state of charge, charging current level, etc.).

Method 400 may then include at block 430, determining an expected flow rate range. The expected flow rate range may include a maximum and a minimum expected gas flow rate level based on the determined battery characteristic(s). For instance, when the charging current level may be used to determine that the expected gas flow rate is between an upper maximum level and a lower minimum level.

Block 440 may include measuring a gas flow rate via the gas flow sensor at the end of the vent tube opposite the battery. Block 450 may then include comparing the measured flow rate to the expected flow rate range. Where the measured flow rate is within the expected range, no protective action may be needed. Method 400 may revert back to block 420 to determine updated battery characteristics.

But if the measured flow rate is below the expected flow rate range, method 400 may include providing an alert to the driver indicating that the vent tube is compromised at block 460. This may include alerting the driver that the vent tub has become disconnected or has a hole. Further, the alert may indicate that battery gas is leaking into the vehicle cabin, and that safety measures should be taken.

And if the measured flow rate is above the expected flow rate range, method 400 may include providing an alert to the driver indicating that the battery is compromised. For instance, the alert may indicate that one or more battery cells have been shorted, or that the battery has become aged and needs to be replaced. Further, the alert may indicate that the driver should visit a service station to have the battery checked.

At block 480, method 400 may include modifying one or more battery charging and discharging characteristics. This may include, for instance, changing a charging voltage or current, disconnecting one or more electronic systems, or taking some other action with respect to the battery. These actions may prevent further degradation of the battery due to increased gas emission, and may prevent harm to vehicle occupants due to venting of the battery gas into the vehicle cabin. Method 400 may then end at block 490.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects. Further, the conjunction "or" may be used to convey features that are simultaneously present instead of mutually exclusive alternatives. In other words, the conjunction "or" should be understood to include "and/or". The terms "includes," "including," and "include" are inclusive and have the same scope as "comprises," "comprising," and "comprise" respectively.

The above-described embodiments, and particularly any "preferred" embodiments, are possible examples of implementations and merely set forth for a clear understanding of the principles of the invention. Many variations and modifications may be made to the above-described embodiment(s) without substantially departing from the spirit and principles of the techniques described herein. All modifications are intended to be included herein within the scope of this disclosure and protected by the following claims.

What is claimed is:

1. A vehicle comprising:
a battery;
a vent tube coupled to the battery for venting gas outside a vehicle cabin;
a gas flow sensor for determining a measured flow rate of the vent tube; and
a processor for:
determining an expected flow rate range based on a battery characteristic; and
while the battery is operating, responsive to determining that the measured flow rate is outside the expected flow rate range, stopping battery charging or discharging operations.

2. The vehicle of claim 1, wherein the battery comprises a first vent port and a second vent port, wherein the vent tube is coupled to the first vent port, and the second vent port is plugged.

3. The vehicle of claim 1, wherein the gas flow sensor is mounted to an exterior of the vehicle.

4. The vehicle of claim 1, wherein the battery characteristic comprises a battery charging current level.

5. The vehicle of claim 1, wherein the processor is further for:
determining that the measured flow rate is below the expected flow rate range; and
responsively alerting a driver that the vent tube has been disconnected.

6. The vehicle of claim 1, wherein the processor is further for:
determining that the measured flow rate is above the expected flow rate range; and
responsively alerting a driver that a battery cell is shorted out.

7. The vehicle of claim 1, wherein the battery characteristic comprises a state of charge, and wherein the processor is further for:
determining that the measured flow rate is above the expected flow rate range; and
responsively lowering a charging voltage.

8. The vehicle of claim 1, wherein the processor is further for determining that the measured flow rate is outside the expected flow rate range while the battery is being charged.

9. A method comprising:
determining, by a gas flow sensor, a measured flow rate of gas emitted by a battery, wherein the gas flow sensor is positioned at a first end of a vent tube opposite a second end of the vent tube coupled to the battery, and wherein the vent tube is configured to vent the gas outside a vehicle cabin;
determining an expected flow rate range based on a battery characteristic; and
while the battery is operating, responsive to determining that the measured flow rate is outside the expected flow rate range, stopping battery charging or discharging operations.

10. The method of claim 9, wherein the battery comprises a first vent port and a second vent port, wherein the vent tube is coupled to the first vent port, and the second vent port is plugged.

11. The method of claim 9, wherein the gas flow sensor is mounted to a vehicle exterior.

12. The method of claim 9, wherein the battery characteristic comprises a battery charging current level.

13. The method of claim 9, further comprising:
determining that the measured flow rate is below the expected flow rate range; and
responsively alerting a driver that the vent tube has been disconnected.

14. The method of claim 9, further comprising:
  determining that the measured flow rate is above the expected flow rate range; and
  responsively alerting a driver that a battery cell is shorted out.

15. The method of claim 9, wherein the battery characteristic comprises a state of charge, the method further comprising:
  determining that the measured flow rate is above the expected flow rate range; and
  responsively lowering a charging voltage.

16. The method of claim 9, further comprising:
  determining that the measured flow rate is outside the expected flow rate range while the battery is being charged.

17. The vehicle of claim 1, wherein the processor is further for: responsive to determining that the measured flow rate is outside the expected flow rate range, electrically disconnecting one or more electronic systems connected to the battery.

18. The vehicle of claim 1, wherein the expected flow rate range is variable with respect to an amount of voltage at which the battery is being charged.

19. The vehicle of claim 18, wherein the expected flow rate range comprises an expected maximum gas flow rate and an expected minimum gas flow rate, wherein the processor is further for, responsive to detecting an increase in the amount of voltage at which the battery is being charged, increase the expected maximum gas flow rate and the expected minimum gas flow rate.

20. The vehicle of claim 1, wherein the expected flow rate range is variable with respect to an amount of power drawn by at least one load electrically coupled to the battery.

* * * * *